(12) United States Patent  
Karlsson

(10) Patent No.: US 7,869,785 B2  
(45) Date of Patent: Jan. 11, 2011

(54) METHOD AND APPARATUS FOR ENHANCING THE SPEED OF WIDEBAND SIGNAL SEARCH SYSTEMS

(75) Inventor: Lars Karlsson, Santa Clara, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 540 days.

(21) Appl. No.: 12/023,162

(22) Filed: Jan. 31, 2008

(65) Prior Publication Data

US 2008/0117993 A1  May 22, 2008

Related U.S. Application Data

(63) Continuation-in-part of application No. 10/829,858, filed on Apr. 21, 2004, now abandoned.

(60) Provisional application No. 60/898,791, filed on Jan. 31, 2007.

(51) Int. Cl.  
*H04B 1/16* (2006.01)

(52) U.S. Cl. ............... 455/334; 455/142; 455/150.1; 455/323; 375/256

(58) Field of Classification Search ............... 455/131, 455/132, 142, 313, 314, 323, 324, 334; 375/136, 375/219, 256, 316, 324  
See application file for complete search history.

(56) References Cited

U.S. PATENT DOCUMENTS

| | | | | |
|---|---|---|---|---|
| 5,790,514 A * | 8/1998 | Marchok et al. | ............ | 370/208 |
| 6,031,879 A * | 2/2000 | Pace et al. | ................. | 375/316 |
| 6,477,196 B1 * | 11/2002 | Swanke et al. | .............. | 375/147 |
| 6,487,252 B1 * | 11/2002 | Kleider et al. | .............. | 375/260 |
| 7,366,243 B1 * | 4/2008 | McCrady | ..................... | 375/259 |
| 2005/0078763 A1* | 4/2005 | Choi et al. | ................. | 375/267 |

* cited by examiner

Primary Examiner—Nhan Le

(57) ABSTRACT

A Method and Apparatus for Enhancing the Speed of Wideband Signal Search Systems provides a system that can perform hyper fast scanning for signals while at the same time provide very good phase noise performance. The method and apparatus provide a way to reduce costs by avoiding the expensive solutions employed by the unmodified prior systems. The method and apparatus have all of the abilities of standard wideband signal collection systems. Secondly the method and apparatus are able to automatically, and extremely quickly, control multiple VCO's in a finely coordinated tuning process. Thirdly, the method and apparatus still have very good phase noise performance, even though it has hyper fast tuning speeds. Fourthly, the preferred method and apparatus pipeline the digitization and tuning phases of the collection process. Finally, the method and apparatus provide real-time control logic to accurately synchronize all events and make them work in the specific procedure at their respective specific microseconds in time.

13 Claims, 4 Drawing Sheets

METHOD AND APPARATUS FOR ENHANCING THE SPEED OF WIDEBAND SIGNAL SEARCH SYSTEMS

This application is a continuation-in-part of application Ser. No. 10/829,858, filed Apr. 12, 2004, now abandoned.

This application is filed within one year of, and claims priority to Provisional Application Ser. No. 60/898,791, filed Jan. 31, 2007.

BACKGROUND OF THE INVENTION

1. Field of the Invention

This invention relates generally to signal intelligence systems and, more specifically, to a Method and Apparatus for Enhancing the Speed of Wideband Signal Search Systems.

2. Description of Related Art

Present day military-grade signal collection and surveillance equipment devices are built to capture communications from enemy radios as well as known and/or clandestine sources. The interception of various wireless communications is a critical signals intelligence function that is vital for national security interests. The problem with prior art signal search and collection is that some of the more modern transmission waveforms are made to intentionally be difficult to detect. These signals are rotating in frequency faster, and across wider frequency ranges, than ever before. Present day signal search systems, with today's A/D converters, cannot capture these signals in one tuning band while simultaneously maintaining the maximum dynamic range. In addition, many modern military-grade transmissions also "hop" across wide ranges of frequencies continually to further avoid detection. Thus, signals collection systems must become more agile in order to first detect and collect these more modern transmissions without compromising on dynamic range. The state of the art today is that modern A/D converters can achieve spurious free dynamic range (SFDR) values close to 100 dB but only at bandwidths of less than 40 MHz.

The invention of this patent application describes a unique way of enhancing the search speed of wideband signal detection systems. This provides the ability to rarely ever miss any signal, even if they are extremely fast moving and are frequency hopping over a vast range of RF spectrum. As mentioned, the invention of this patent application is an extension and augmentation to a previously filed U.S. patent application Ser. No. 10/829,858: "Method And Apparatus For The Intelligent And Automatic Gathering of Sudden Short Duration Communications Signals", also written by this author. That patent will be referenced continually throughout this patent application, and the disclosure therein is incorporated herein by reference.

What is needed therefore in order to feasibly detect and collect more modern and faster signals is a system that not only as: 1) The abilities stated in the aforementioned previous patent application Ser. No. 10/829,858 (i.e. the ability to perform wideband detection of short duration communications signals), but also 2) The ability of pipeline processing and tuning functions at the same time, and 3) The ability to control all of this logic automatically in real-time, and finally 4) The ability to precisely synchronize internal dataflows to accommodate the faster processing rates. The apparatus of this patent application provides such a System. In conclusion, insofar as I am aware, no invention formerly developed provides this unique method to create a hyper fast wideband signals collection system. The technique uses an innovative multi voltage controlled oscillator (VCO) approach, coupled with pipelined wideband digitization stages.

BRIEF DESCRIPTION OF THE DRAWINGS

The objects and features of the present invention which are believed to be novel, are set forth with particularity in the appended claims. The present invention, both as to its organization and manner of operation, together with further objects and advantages, may best be understood by reference to the following description, taken in connection with the accompanying drawings, of which:

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a Method and Apparatus for Enhancing the Speed of Wideband Signal Search Systems.

The continuing escalation of radio technology has led to the necessity of having faster and faster wideband signals intelligence systems to detect and collect more modern enemy transmissions. There is an urgent need in the U.S. military and intelligence communities to create systems that can have faster search rates, but without compromising phase noise performance. Wideband receiver technology today needs to get much faster than ever before. But a fundamental change in how the signals collection systems are architected is required in order to support faster scan speeds. The apparatus of this provision patent application provides such a unique approach.

Figure 1:
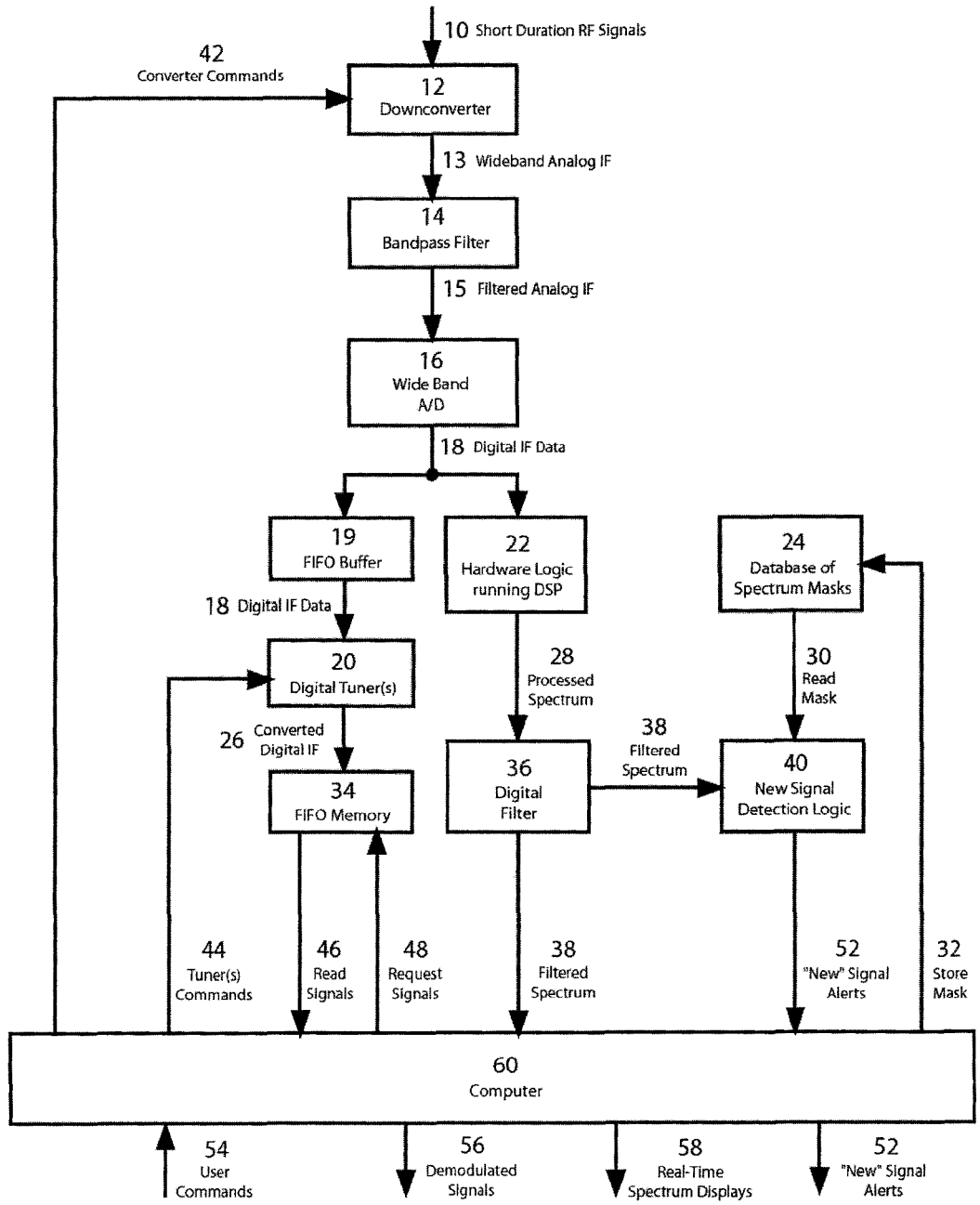
FIG. 1 is a prior art block diagram of the wideband signal processing and analysis system invention of patent Ser. No. 10/829,858.

The present invention can best be understood by initial consideration of FIG. 1. FIG. 1 is a prior art block diagram of the wideband signal processing and analysis system invention of patent Ser. No. 10/829,858. The diagram shows a single tuner in the receiver system, to sequentially collect blocks of spectrum data.

The prior-art of FIG. 1 shows a block diagram of the process of the wideband signal search, collection and analysis system to detect short duration signals. The description of this system invention will not be covered in detail here, that is rather is already covered in the previous patent application (U.S. patent application Ser. No. 10/829,858). That system is referenced here to show the reader how this prior art is augmented with the present invention.

What is to be noticed in the prior art method is that a single channel downconverter is used which serializes that data flow as it moves from one frequency setting to the next. The resulting wideband analog IF signals are then filtered and digitized by the wideband A/D, one tuning range after the other (i.e. serially). This prior art system tunes the downconverter to a region of the RF spectrum, and then collects data for the backend processing. The backend processing unit must then wait until the downconverter can pre-tune the oscillator to the next region of spectrum before it can collect and process new data. This process is serialized and there are inefficiencies with the approach.

Furthermore, if a fast signal suddenly appears in a frequency range that has been passed over by the downconverter already, it will not be detected until the downconverter can come back again and revisit that region. This of course can be improved by having a faster tuning speed for the downconverter (i.e. which would yield a faster revisit rate).

But simply increasing the downconverter VCO tuning speed is insufficient as that may cause worse phase noise performance typical. Furthermore, the reality is that a single VCO can never achieve zero tuning time.

Figure 2:
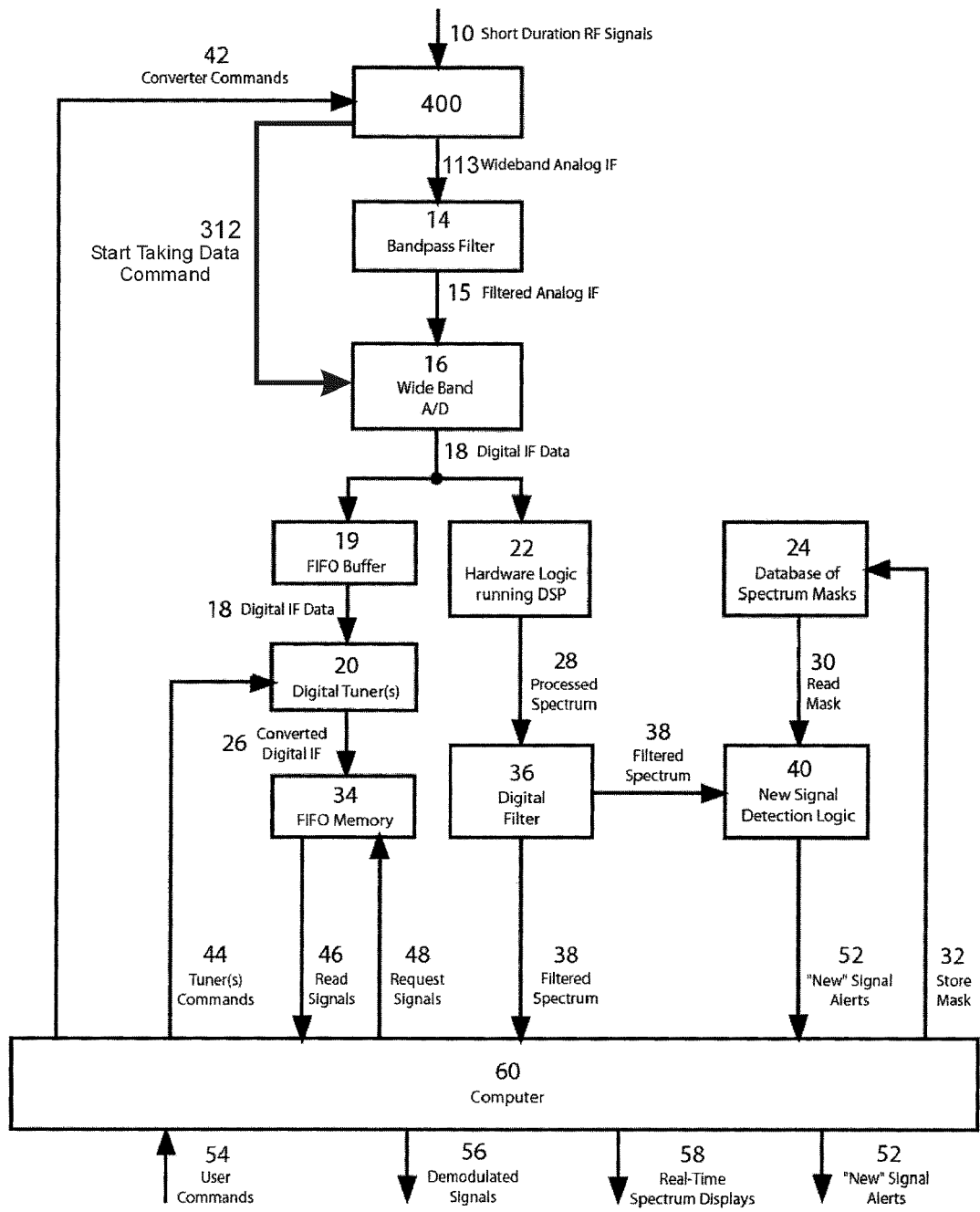
FIG. 2 is a block diagram showing how the invention enhances the prior art system by modifying some of the blocks with a unique technical approach.

FIG. 2 is a block diagram showing how the invention enhances the prior art system by modifying some of the blocks with a unique technical approach.

FIG. 2 shows the same block diagram as depicted in FIG. 1, only this time modified with the present invention. As can be seen, the downconverter's single oscillator is replaced by the invention which, in this example, has two VCO's and feedback loops to optimize the speed of the search process. There is a feedback signal now that feeds the backend processing system with header information to an uninterrupted flow of wideband IF data.

The invention must signal the backend processing by inserting headers so the backend processing circuit can recognize what portions of the continuous stream that belongs to each frequency. This is critical to the invention. It is important to note that the invention can use multiple VCO's (i.e. the 2-VCO system shown here is exemplary only).

Figure 3:
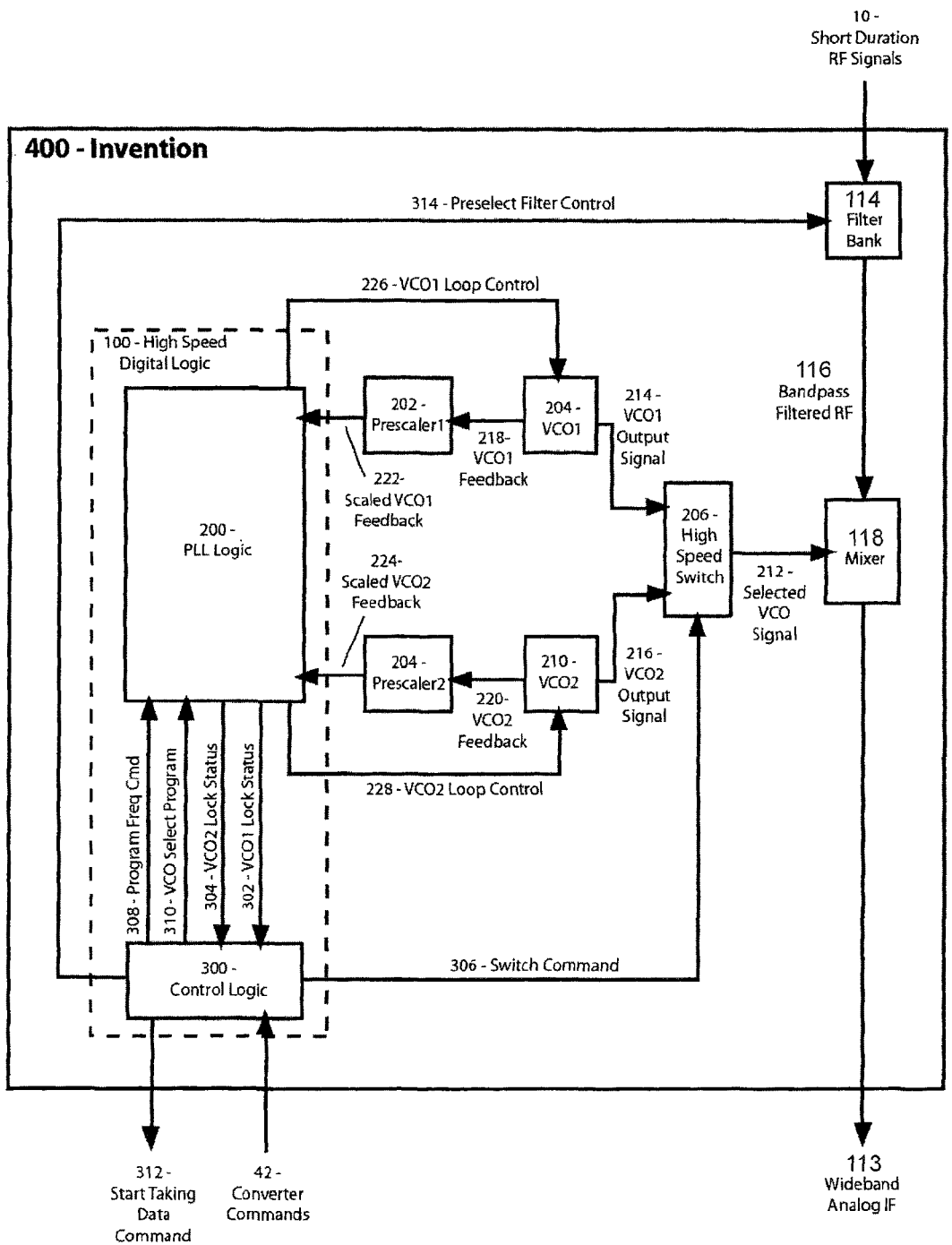
FIG. 3 is a detailed example block diagram of the invention using dual VCO PLL chains.

FIG. 3 is a detailed example block diagram of the invention using dual VCO PLL chains. The diagram pipelines the processing stages while the system tunes in parallel to the next target frequency band. It is worthy to note that this new approach provides a fast scanning system that does not compromise on receiver phase noise performance. The use and real-time implementation of multi VCO sub-modules, coupled with a pipelined wideband digitizer and processing, are the keys to increasing the search speed.

FIG. 3 outlines a detailed example block diagram of the invention. The embodiment of the invention of this patent application is implemented in hardware, in real-time, without any human intervention. If is fully automatic.

As can be seen, the embodiment of the present invention has a unique control and feedback process. The combination of which allows the entire wideband collection system to tune hyper fast, but while still maintaining the good phase noise performance.

This embodiment of the invention is unique since no other device has the capability or performance to perform these operations, automatically, and in real-time.

DIAGRAM REFERENCE NUMERALS

10 Short Duration RF Signals
13 Wideband Analog IF
14 Filter Bank
16 Bandpass Filtered RF
18 Mixer
42 Converter Commands
100 High Speed Digital Logic
200 Phase Locked Loop (PLL) Logic
202 Prescaler #1
204 Voltage Controlled Oscillator #1 (VCO1)
206 High Speed Switch
208 Prescaler
210 Voltage Controlled Oscillator #2 (VCO2)
212 Selected VCO Signal
214 VCO1 Output Signal
216 VCO2 Output Signal
218 VCO1 Feedback Signal
220 VCO2 Feedback Signal
222 Scaled VCO1 Feedback
224 Scaled VCO2 Feedback
226 VCO1 Loop Control
228 VCO2 Loop Control
300 Control Logic
302 VCO1 Lock Status
304 VCO2 Lock Status
306 Switch Command
308 Program Frequency Command
310 VCO Program Select
312 Start Taking Data Command
314 Preselect Filter Control
400 Present Embodiment of the Invention Operation The system of the present embodiment of the invention adds hyper speed tuning and processing capabilities to the previous patent application Ser. No. 10/829,858, "Method and Apparatus for the Intelligent and Automatic Gathering of Sudden Short-duration Communications Signals." Adding hyper speed tuning/processing capabilities to the previous invention requires the following: the addition of an innovative tuning architecture that can handle continuous agile tuning; the addition of a set of feedback signals to coordinate backend processing; the addition of high speed digital logic to control all these functions in real-time; and finally the addition of specialized firmware to parse out the data from the continuous wideband analog IF stream.

The short duration RF signals 10 are taken from an antenna and fed into the Invention Embodiment 400. The signals are then filtered by a Filter Bank 114 which has a commandable set of preselect filters. The filter to use is commanded by the Preselect Filter Control 314 which comes from the Control Logic 300. The control logic is explained further in this patent. This filter block is necessary to isolate the receive band of interest and provide image frequency rejection. The output of the filter block is a Bandpass Filtered RF signal 116.

The Bandpass Filtered RF signal 116 is then fed to the Mixer 118. The mixer has a "local oscillator" input that is switched between one or two different voltage controlled oscillators (VCO's). The purpose of the mixer is to downconvert the incoming RF signal to the Wideband Analog IF signal 113. From there, the Wideband Analog IF Signal 113 is fed to the rest of the backend processing system exactly as before (described in the '858 application). The difference with this Invention embodiment is that the wideband analog IF is a continuous stream of data from one downconversion frequency setting after another. The backend portions of the signal collection system then are provided the information in order process the stream appropriately. This allows the system to monitor far more frequency ranges per second than normally possible without this Invention.

The embodiment of the present Invention has a High Speed Digital Logic 100 component which is programmed to handle all the high speed timing of this embodiment of the invention. This component can be, for example, a field programmable gate array (FPGA). The High Speed Digital Logic 100 component has two major functions. The first is the Phase Locked Loop (PLL) Logic 200 function and the other is the Control Logic 300 function. Both are essential and integral to this embodiment of the invention. The PLL Logic 200 is comprised of all the firmware necessary to handle the loop controls and to change frequency for the (in this example) dual VCO's (labeled VCO1 and VCO2). The Control Logic 300 is comprised of all the firmware necessary to handle the interfaces and timing for the various sub-modules of the Invention Embodiment 400.

When an operator programs the system to scan regions of RF spectrum, the first thing that happens is that that frequency monitoring part is sent via the Converter Commands 42 to the High Speed Digital Logic 100 sub-module. More specifically, the Converter Commands 42 are processed by the Control Logic 300 and loaded. Then, the Control Logic 300 sends a Program Frequency Command 308 to the PLL Logic 200, along with a VCO Select Program 310 signal (which selects either VCO1 or VCO2 to be programmed). This allows the PLL Logic 200 to properly set the selected VCO to the right oscillation frequency.

For example, if VCO1 was to be programmed, the VCO1 Loop Control 226 signal is sent to the VCO1 to command it higher or lower in frequency. The VCO1 204 sub-module responds and VCO1 Feedback Signal 218 is output. The VCO1 Feedback Signals 218 is then sent to Prescaler #1 202 which in turn decimates the signal frequency so that it can be sampled by the PLL Logic 200. The decimated signal, Scaled VCO1 Feedback 222 is sampled by the PLL Logic 200, and compared with the reference frequency. If it is not the right frequency, then the VCO1 Loop Control 226 is adjusted appropriately so that VCO1 204 is brought closer to the correct frequency. This standard loop filter finally will provide the closed loop control so that the VCO1 is phase locked to the right frequency. This function is similar in any phase locked oscillator.

The exact same process is done for VCO2 210. The result is that there are two independently controlled and programmed, VCO's running in the Invention Embodiment 400. This provides the High Speed Switch 206 with two active signals all the time. The Control Logic 300 will then control which Selected VCO Signal 212 is output, and at what microsecond to the Mixer 18.

When the Invention Embodiment 400 outputs the correct Wideband Analog IF 13 to the backend processors, the VCO1 Lock Status signal is sent to the Control Logic 300. That allows the Control Logic to know that it is on target. The Control Logic 300 then sends the Start Taking Data Command 312 to the A/D converter control of the system. This gives the firmware control of the A/D converter the "keying" signal it needs to know that the IF datastream is ready for processing, and at what particular frequency.

Simultaneously with the above, the alternate VCO is being re-tuned to the next frequency in the frequency monitoring plan by the PLL Logic 200. Thus, when the system is ready to move on to the next frequency segment, the alternate VCO (in this case VCO2) is already locked on and standing by. This innovation thus provides the fastest tuning speed possible as there is never any re-tuning time recognized by the system data collection.

Furthermore, this innovation allows the system to have good phase noise performance since the PLL filter can be optimized far best phase noise without having to compromise the oscillator's lock time. Many prior art systems do not do this, they try to push the speeds of the VCO's to lock faster (by opening up the loop filter), but ultimately phase noise then has to be traded off to achieve maximum tuning speed. This embodiment of the invention does not have that shortcoming.

Again, the operation of the system from the standpoint of the backend processing is the same as described by patent application Ser. No. 10/829,858 (see that application for details). The innovation of this embodiment of the invention is that it allows wideband surveillance systems to always be collecting data. The collection and processing of data is done in parallel with the pre-tuning to the next frequency. This allows for an almost zero re-tune time.

The backend processing is keyed at the right time from the Start Taking Data Command 312 so that it knows where in the datastream which data belongs to what frequency setting.

Figure 4:
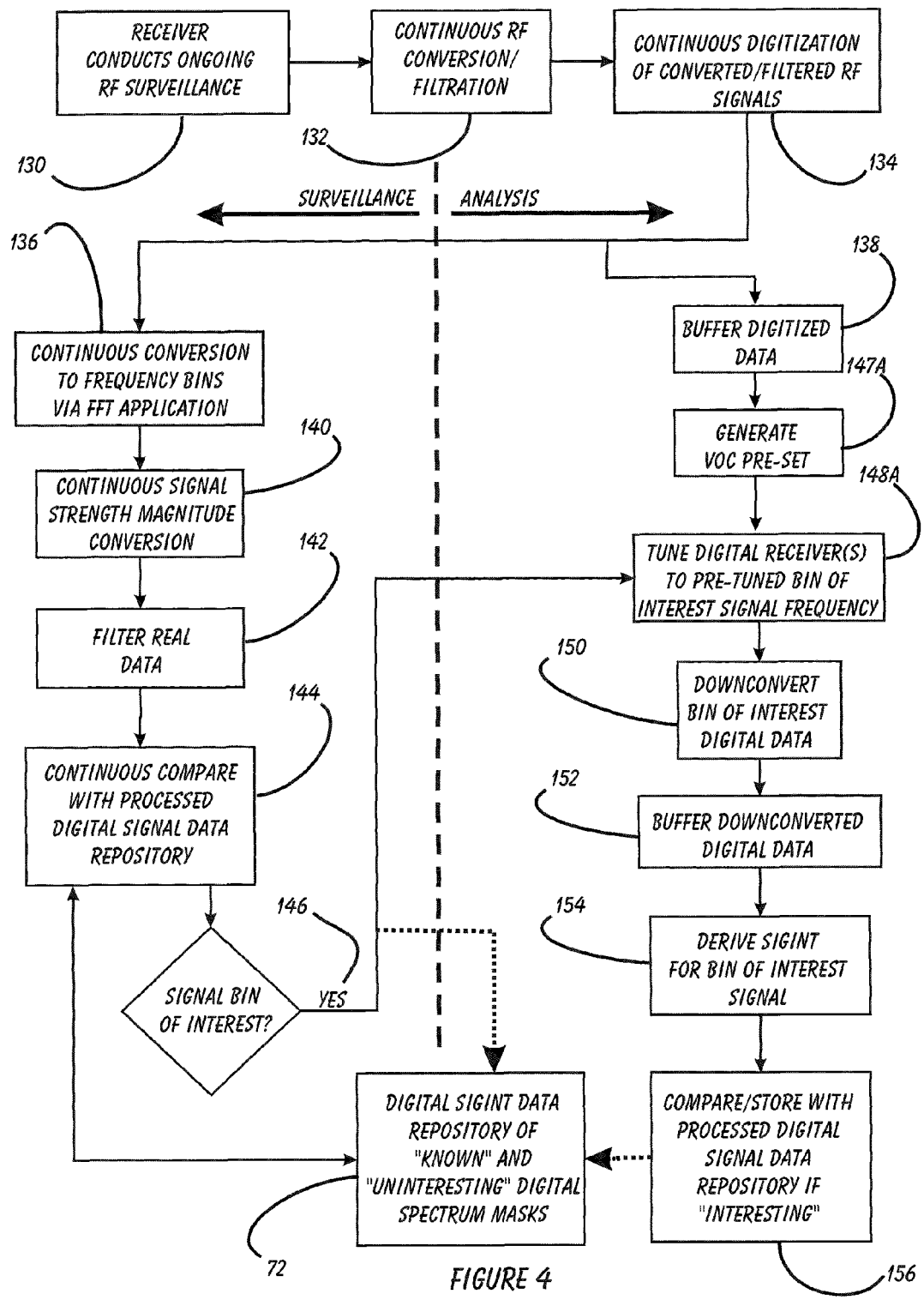
FIG. 4 is a flowchart depicting the operational method of the system of FIG. 3.

FIG. 4 is a flowchart depicting the operational method of the system of FIG. 3. Rather than utilizing a scanning analog RF receiver, the system of the present embodiment of the invention uses a "surveillance" analog receiver, also perhaps called a converter. The surveillance receiver does not scan a narrow band of frequency, but instead simply "listens" to for any emissions on virtually any RF frequency, and very significantly, at very low detection levels. The received/detected analog RF is continuously converted and filtered 132, and then converted into digital data 134. The digitized data then passes to two branches on a continuous basis—the surveillance branch and the analysis branch of the method. Absent further action, the digitized data continuously updates a memory buffer 138 for later analytical use.

A VOC presetting 147A is generated in response to the PLL Logic (see FIG. 3). This insures that one of the controlled VOC's is already tuned to the frequency bin of the buffered digitized data. As a result, when a "bin of interest" is detected by the surveillance branch 146, the digital receivers (through use of the preset "on duty" VOC) will essentially be pretuned to that frequency bin of interest 148A. The digital receivers will "download" the data originally buffered (see step 138).

The surveillance branch of the prior method is essentially unchanged. The digitized data passing to the surveillance branch is continuously split into narrow bands or bins of frequency 136 through application of an FFT. Next, the signal strength of each frequency bins is maximized by summing all of the components of any signals detected in each bin 140—this preserves the real signal data in order to accentuate the amplitude of any bins containing signals.

The summed or real data is then filtered 142 after which it is continuously compared to a data repository containing spectrum masks of known signals 72. If a frequency bin contains a detected signal of interest 146, then one or more digital receivers are tuned to the frequency represented by that bin 148. Since the digital receivers are actually receiving buffered digital data, these digital receivers can actually tune to the bin of interest frequency before the data of interest "arrives" at the digital receivers. The digital data from the tuned digital receiver(s) is downconverted 150 and then buffered 152 again so that the SIGINT can be derived from the signal 154. The signal and its derived SIGINT is then, optionally, compared and/or stored 156 with the digital data repository of spectrum masks. Unlike the prior systems, the new method will not only detect more signals (and particularly short-duration signals), but it will also allow the operator to conduct in-depth analysis of virtually any detected signal, no matter its duration.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A signal intelligence system, comprising:
a surveillance receiver for receiving RF signals across a broad spectrum;

a digitizer for creating a continuous stream of digitized data representing said received RF signals;

digital data converter for converting said digitized data into frequency bins;

a comparing element for comparing each said bin to data stored in a data repository;

a buffer for buffering said digitized data taken separately from said continuous stream prior to said digital data converter converting, whereby said digitized data is buffered in parallel to said converting by said digital data converter;

a digital receiver for receiving a narrow band of said buffered digitized data;

a tuning preset element for establishing presetpoints for said digital receiver; and a trigger element responsive to said comparing, for triggering said digital receiver to tune to a frequency of interest in accordance with said presetpoints.

2. The system of claim 1, wherein said tuning preset element comprises two or more oscillation elements, one said oscillation elements being preset to a presetpoint responsive to said digital data converter.

3. The system of claim 2, wherein said digital receiver tunes to a frequency of interest and receives data from said buffer.

4. The system of claim 3, wherein said digital data converter comprises a subsystem for converting said digitized data from a time domain to a frequency domain.

5. The system of claim 4, wherein said digital data converter comprises a subsystem for converting said frequency domain converted data from separate real and imaginary components to normalized amplitude data.

6. The system of claim 5, wherein said normalized amplitude data is categorized by frequency bins.

7. The system of claim 6, wherein said comparing element comprises comparing data in said frequency bins to frequency masks stored in said data repository.

8. The system of claim 7, wherein said trigger elements is responsive to a received said frequency bin being previously absent from said data repository.

9. A method for analyzing RF signal transmission comprising the steps of:

detecting an analog RF signal transmission;

digitizing said detected RF signal;

buffering said digitized signal;

converting said digitized signal into frequency bins, said converting conducted in parallel with said buffering;

comparing said frequency bins to known frequency bin data;

presetting a pretuning system to a setpoint responsive to said converting and comparing; and triggering a digital receiver to receive said buffered non-converted digitized signal data, said triggering responsive to said comparing.

10. The method of claim 9, wherein said triggering step comprises tuning a digital receiver to a frequency corresponding to said pretuning preset setpoint.

11. A method for analyzing RF signal transmissions comprising the steps of:

detecting an analog RF signal transmission;

digitizing said detected RF signal;

splitting said digitized signal into a surveillance branch signal and an analysis branch signal, said surveillance branch signal and said analysis branch signal being essentially identical;

buffering said analysis branch digitized signal;

converting said surveillance branch digitized signal into frequency bins, said buffering and said converting being continuous and simultaneous;

comparing said frequency bins to known frequency bin data;

presetting a pretuning subsystem to a setpoint responsive to said converting and comparing; and triggering a digital receiver to receive said buffered data, said triggering responsive to said comparing and said preset setpoint.

12. The method of claim 11, further comprising a second buffering step, said second buffering step comprising buffering data received by said digital receiver.

13. The method of claim 12, wherein said triggering step comprises tuning a digital receiver to a frequency in close proximity to a frequency represented by a said compared frequency bin.

* * * * *

UNITED STATES PATENT AND TRADEMARK OFFICE
CERTIFICATE OF CORRECTION

| | | |
|---|---|---|
| PATENT NO. | : 7,869,785 B2 | Page 1 of 1 |
| APPLICATION NO. | : 12/023162 | |
| DATED | : January 11, 2011 | |
| INVENTOR(S) | : Lars Karlsson | |

It is certified that error appears in the above-identified patent and that said Letters Patent is hereby corrected as shown below:

In column 7, line 38, in Claim 8, delete "elements" and insert -- element --, therefor.

In column 7, line 41, in Claim 9, delete "transmission" and insert -- transmissions --, therefor.

Signed and Sealed this
Twelfth Day of April, 2011

David J. Kappos
*Director of the United States Patent and Trademark Office*